United States Patent
Norman

(10) Patent No.: US 7,327,600 B2
(45) Date of Patent: Feb. 5, 2008

(54) STORAGE CONTROLLER FOR MULTIPLE CONFIGURATIONS OF VERTICAL MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 147 days.

(21) Appl. No.: 11/342,491

(22) Filed: Jan. 30, 2006

(65) Prior Publication Data

US 2006/0164882 A1   Jul. 27, 2006

(51) Int. Cl.
*G11C 11/00*   (2006.01)

(52) U.S. Cl. ......................... 365/158; 365/63

(58) Field of Classification Search ............... 365/158, 365/63
See application file for complete search history.

(56) References Cited

U.S. PATENT DOCUMENTS

| | | | |
|---|---|---|---|
| 5,418,743 | A  | 5/1995  | Tomioka et al. |
| 5,537,631 | A  | 7/1996  | Wong et al. |
| 6,055,178 | A  | 4/2000  | Naji |
| 6,067,248 | A  | 5/2000  | Yoo |
| 6,111,781 | A  | 8/2000  | Naji |
| 6,445,612 | B1 | 9/2002  | Naji |
| 6,466,503 | B2 | 10/2002 | Koizumi et al. |
| 6,487,106 | B1 | 11/2002 | Kozicki |
| 6,657,888 | B1 | 12/2003 | Doudin et al. |
| 6,731,528 | B2 | 5/2004  | Hush et al. |
| 6,807,088 | B2 | 10/2004 | Tsuchida |
| 6,825,489 | B2 | 11/2004 | Kozicki |
| 6,972,985 | B2 | 12/2005 | Rinerson et al. |
| 7,002,197 | B2 | 2/2006  | Perner et al. |
| 7,075,817 | B2 | 7/2006  | Rinerson et al. |
| 2003/0061560 | A1 | 3/2003  | Furukawa |
| 2003/0132456 | A1 | 7/2003  | Miyai et al. |
| 2004/0141369 | A1 | 7/2004  | Noguchi |
| 2005/0135148 | A1 | 6/2005  | Chevallier et al. |
| 2005/0151156 | A1 | 7/2005  | Wu et al. |
| 2005/0172066 | A1* | 8/2005 | Spencer et al. ............. 711/103 |

OTHER PUBLICATIONS

U.S. Appl. No. 60/536,115, filed Jan. 13, 2004, Wu et al.
A.Baikalov, et al, "Field-driven hysteretic and reversible resistive switch at the Ag-Pr0.7Ca0.3MnO3 interface" Applied Physics Letters, vol. 83, No. 5, Aug. 4, 2003, pp. 957-959.
A. Sawa, et al, "Hysteretic current-volyage characteristics and resisitance switching at a rectifying Ti/$Pr_{0.7}Ca_{0.3}MnO_3$ interface" Applied Physics Letters, vol. 85, No. 18, Nov. 1, 2004, pp. 4073-4075.
R. Oligschlaeger, R. Waser, R. Meyer, S. Karthäuser, R. Dittmann, "Resistive switching and data reliability of epitaxial (Ba,Sr)TiO thin films," Applied Physics Letters, 88 (2006), 042901.

(Continued)

*Primary Examiner*—Huan Hoang

(57) ABSTRACT

Storage development using vertical memory is described. A memory system includes a controller and a non-volatile memory array. The non-volatile memory array is vertically stacked relative to the controller. The controller communicates with external devices through an interface and processes requests from the external devices to store and retrieve data. The controller additionally accesses the non-volatile memory array and performs diagnostic functions on the non-volatile memory array. The controller may be designed to handle multiple memory layer configurations such that the same controller can be used for both N layers and M layers of memory.

13 Claims, 7 Drawing Sheets

OTHER PUBLICATIONS

S. Lai, T. Lowrey, "OUM—A 180 nm nonvolatile memory cell element technology for standalone and embedded applications," IEEE International Electron Device Meeting, Technical Digest, 803 (2001).

J. Mizusaki J, Y. Yonemura, H. Kamata, K. Ohyama, N. Mori, H. Takai, H. Tagawa, M. Dokiya, K. Naraya, T. Sasamoto, H. Inaba, T. Hashimoto, "Electronic conductivity, Seebeck coefficient, defect and electronic structure of nonstoichiometric $La_{1-x}Sr_xMnO_3$," Solid State Ionics 132, 167 (2000).

Zhao Y. G. ; Rajeswari M. ; Srivastava R. C. ; Biswas A. ; Ogale S. B. ; Kang D. J. ; Prellier W. ; Zhiyun Chen ; Greene R. L. ; Venkatesan T., "Effect of oxygen content on the structural, transport, and magnetic properties of $La_{1-delta}Mn_{1-delta}O_3$ thin films," Journal of Applied Physics, vol. 86, No. 11, Dec. 1999, pp. 6327-6330.

J. R. Stetter, W. R. Penrose, S. Yao, "Sensors, Chemical Sensors, Electrochemical Sensors, and ECS," Journal of The Electrochemical Society, 150 (2), S11-S16 (2003).

B. C. H. Steele, A. Heinzel, "Materials for Fuel-Cell Technologies," Nature 414, Nov. 2001, pp. 345-352.

A. Reller, J. M. Thomas, D. A. Jefferson, M. K. Uppal, "Superstructures Formed by the Ordering of Vacancies in a Selective Oxidation Catalyst: Grossly Defective $CaMnO_3$," Proceedings of the Royal Society of London, vol. 394, No. 1807 Aug. 1984, pp. 223-241.

A. J. Millis, "Cooperative Jahn-Teller effect and electron-phonon coupling in $La_{1-x}A_xMnO_3$," Phys. Rev. B 53, 8434-8441 (1996).

* cited by examiner

STORAGE CONTROLLER FOR MULTIPLE CONFIGURATIONS OF VERTICAL MEMORY

FIELD OF THE INVENTION

The present invention relates generally to semiconductors and, more specifically, storage systems.

BACKGROUND OF THE INVENTION

Semiconductor fabrication techniques are constantly improving in order to add complex functionality on smaller wafers with corresponding die sizes. Conventional memory devices are fabricated using technologies such as static random access memory (SRAM) or Flash. Flash memory technology is widely used because of capacity, lower costs, and non-volatility characteristics (i.e., stored data is not lost when a power supply or source to the Flash memory device is turned off). However, there are issues with conventional implementations designed to accommodate increasingly complex memory or logic controller ("controller") circuitry on a substrate, wafer, or chip (hereafter "chip").

Conventional memory technologies have restricted die sizes and fabricate separate controller and memory blocks alongside each other on a chip. Complex controller design can also be implemented using multiple processors or additional functionality such as buffer memory, error correction code (ECC), and direct memory access (DMA) hardware for fast movement of data. However, complex controller designs also result in larger die sizes. Another problem with conventional memory technologies is the cost associated with manufacturing and testing separate controller and memory block configurations on the same chip.

Flash memory products require different testing techniques and technologies for controllers and memory blocks. If separate fabrication technologies are used, individually-dedicated testing techniques and facilities are required for the controller and the memory. Separate fabrication and testing techniques and facilities are used with conventional implementations because costs are less than those associated with chips having a combined controller and memory block.

Combined controller and memory designs are expensive to fabricate and test, particularly if the chips are designed to have large memory capacities. An example of a combined controller and memory using Flash technology is developed by M-Systems Incorporated of Sunnyvale, Calif. The controller and memory are combined into a single IC known as a "disk on chip." However, conventional combined controller-memory implementations such as "disk on chip" suffer from limited capacity due to the combined controller and memory. Conventional combined controller-memory implementations are also inefficient because the logic design for the controller requires additional circuitry to isolate the controller and the memory to allow for independent testing of each block.

There are continuing efforts to improve upon memory and controller designs.

BRIEF DESCRIPTION OF THE DRAWINGS

Various embodiments of the invention are disclosed in the following detailed description and the accompanying drawings.

DETAILED DESCRIPTION OF THE PREFERRED EMBODIMENTS

The invention can be implemented in numerous ways, including as a system, a process, an apparatus, or a computer readable medium such as a computer readable storage medium or a computer network wherein program instructions are sent over optical or electronic communication links. In general, the steps of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
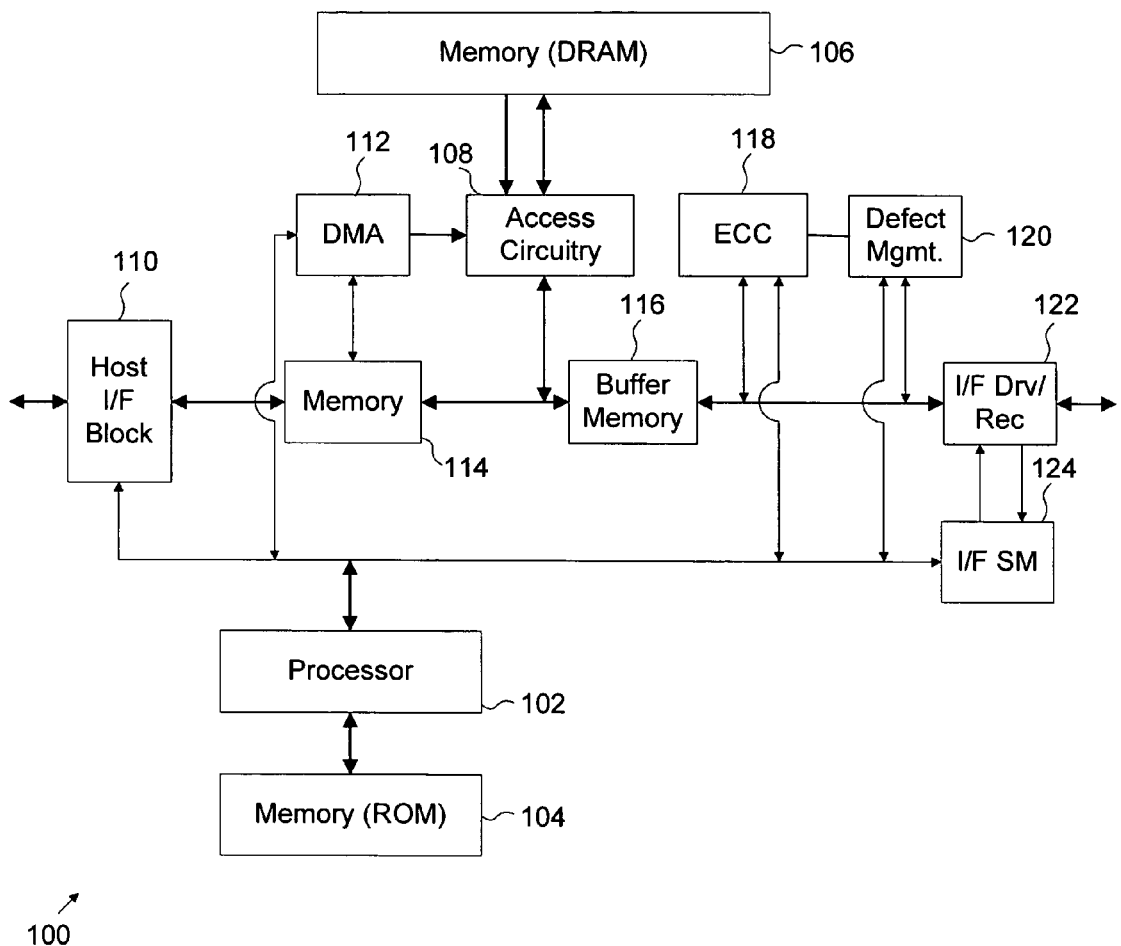
FIG. 1 illustrates an exemplary system for storage development using a vertical memory.

FIG. 1 illustrates an exemplary system 100 for storage development using a vertical memory. System 100 may be fabricated using memory technologies that enable data to be stored and retrieved from various memory locations. Here, system 100 includes processor 102, memory 104, memory 106, access circuitry 108, host interface (I/F) block 110, direct memory access (DMA) block 112, memory 114 (often implemented as SRAM), buffer memory 116, error correction code (which may also be referred to as error checking and correction or ECC) 118, defect management block 120, interface driver/receiver 122, and interface (I/F) state machine (SM) 124. Memory implementations in system 100 may be implemented as random access memory (RAM), read only memory (ROM), dynamic random access memory (DRAM), static/dynamic random access memory (SDRAM), and others. Specifically, memory 104 may be implemented as ROM and memory 106 may be implemented as RAM. Buffer memory 116 may be implemented to temporarily store and access data while system 100 is operating, enabling faster data processing. In some embodiments, buffer memory 116 may be implemented as a first-in, first-out (FIFO) buffer. In other embodiments buffer memory 116 may be implemented differently, such as with standard SRAM. Other components are described, including logic for controlling operations that access memory locations throughout system 100.

Components may be referred to as "blocks" or "modules." The various blocks included in system 100 may be used to implement functionality for a storage system that interfaces with various internal memory systems (hereafter "memory") and external devices that are either requesting or storing data in system 100. External devices may include other software or hardware that, through I/F Drv/Rec 122, interfaces with system 100 to retrieve or store data. In other embodiments, more or fewer blocks may be included in system 100. Further, different blocks may be used to implement various types of functionality beyond that described above.

Here, processor 102 provides logic configured to provide controller functions. Software code written in languages such as C may provide instructions on how system 100 (i.e., processor 102 and access circuitry 108) processes requests to either retrieve or store data from various memory locations in system 100. Other functions performed by processor 102 may include initializing controller logic when power is applied (i.e., "on" voltage is applied), performing diagnostic checks, interpreting commands for memory functions, memory management, ECC-related functions, and others. Processor 102 also interprets commands from host I/F block 110 to establish data flow control using DMA block 112. Host I/F block 110 may be used to implement complex functionality that enables system 100 to integrate with other systems, for example, in a computer. Some functions that may be performed by host I/F block 110 include encoding/decoding (e.g., 8-bit/10-bit), scrambling (to reduce electromagnetic interference (EMI)), parity/cyclic redundancy check (CRC)/ECC checking, disparity generation and checking, interface state machine functions, data buffer (e.g., first-in, first-out (FIFO)) buffer, alignment and primitive check and generation (e.g., checks performed on serial interfaces), and others. Some of these functions may also be implemented using other blocks in system 100.

In some embodiments, system 100 may be implemented as a memory card, including memory storage and controller logic. A memory card may be connected to host interface block 110 using an interface connector (not shown). A chip using system 100 may be configured to receive electrical signals from external devices through an interface connector. The electrical signals are interpreted and acted upon depending upon an interface standard (e.g., IEEE) used for command and data passing. Electrical signals may be sent and received to pass data to and from memory 106 via host I/F block 110 and access circuitry 108. Host I/F block 110 sends commands and data to memory 106 via DMA 112 and access circuitry 108. In embodiments where memory 106 is DRAM memory, access circuitry 108 will typically be implemented as a DRAM controller, which may be used to access, retrieve, and store data in memory 106 while power is being supplied. Access circuitry 108 also determines addresses for data stored in memory 106. Access circuitry 108 is necessary when a memory array is too complex to be accessed directly.

Regardless of the specific type of memories used, memory cells are typically addressed with two signals that are effective to select a single cell or a group of cells in from a given memory array. Depending on the technology, the selection signals are either carried on bit lines and word lines or row and column lines.

For some memory technologies, selectively applying voltages or currents to terminals connected to row and column leads, the conductivity characteristics of various materials (e.g., ferroelectric, perovskite, chalcogenide and others) used in memory cells may be changed. The conductivity characteristics (resistive states) of memory cells may be changed to store binary data bits (e.g., whether a cell's resistive state indicates a "0" or "1"). This "memory effect" applies to the various memory configurations described. In some embodiments, blocks within system 100 may be vertically configured. For example, memory 104, memory 106, memory 114 or memory 116 may be vertically stacked or configured relative to the other blocks of system 100. These techniques are described in greater detail below in connection with FIGS. 2-7.

Referring back to FIG. 1, system 100 may use multiple specialized memory controllers to enable faster data retrieval and storage from various memory locations. In some embodiments, DRAM technology may be used to implement memory 106 and access circuitry 108. DRAM is volatile and requires a periodic refresh in order to retain data in memory while power is on. Access circuitry 108 may be implemented using logic that processes data stored in and retrieved from memory 106. In some embodiments, multiple DRAM-based memory controllers may be used in order to improve processing times. System 100 may also include logic that determines how data is shared with external devices.

In some embodiments, I/F SM 124 may be configured to send or receive data from an external device indicated by addresses in electrical signals. A "handshake" may be performed with the indicated external device through an I/F Dev/Rec module 122, which acts as a memory interface bus to establish a connection. After establishing a connection between the device and system 100 (via I/F Drv/Rec module 122), data may be passed between memory 104, 106, or 114 (via buffer memory 116) to the indicated device. I/F Dev/Rec module 122 works in conjunction with I/F SM 124, which performs handshaking and data flow handling to external devices using data in memory 104 or 106 controlled by system 100. I/F SM 124 may also include other functionality to support interfaces between system 100 and external devices. External devices may also include other processes, logic, circuits, components, or functionality included in an IC. System 100 may be used to develop storage systems that are vertically configured to allow memory blocks or controller blocks to be vertically configured (i.e., built, stacked, or developed) to reduce die size while increasing functionality.

Multiple memory layers may be vertically stacked in order to increase storage capacity of chips without increasing die sizes. Memory 104 and/or 106 and access circuitry 108 may be configured to occupy the same die area, but are vertically stacked in layers or "planes." A vertical configuration thereby reduces overall die size, reduces manufacturing and test costs, and increases capacity. This configuration allows multiple planes of memory to be placed on top of or below access circuitry 108.

Figure 1B:
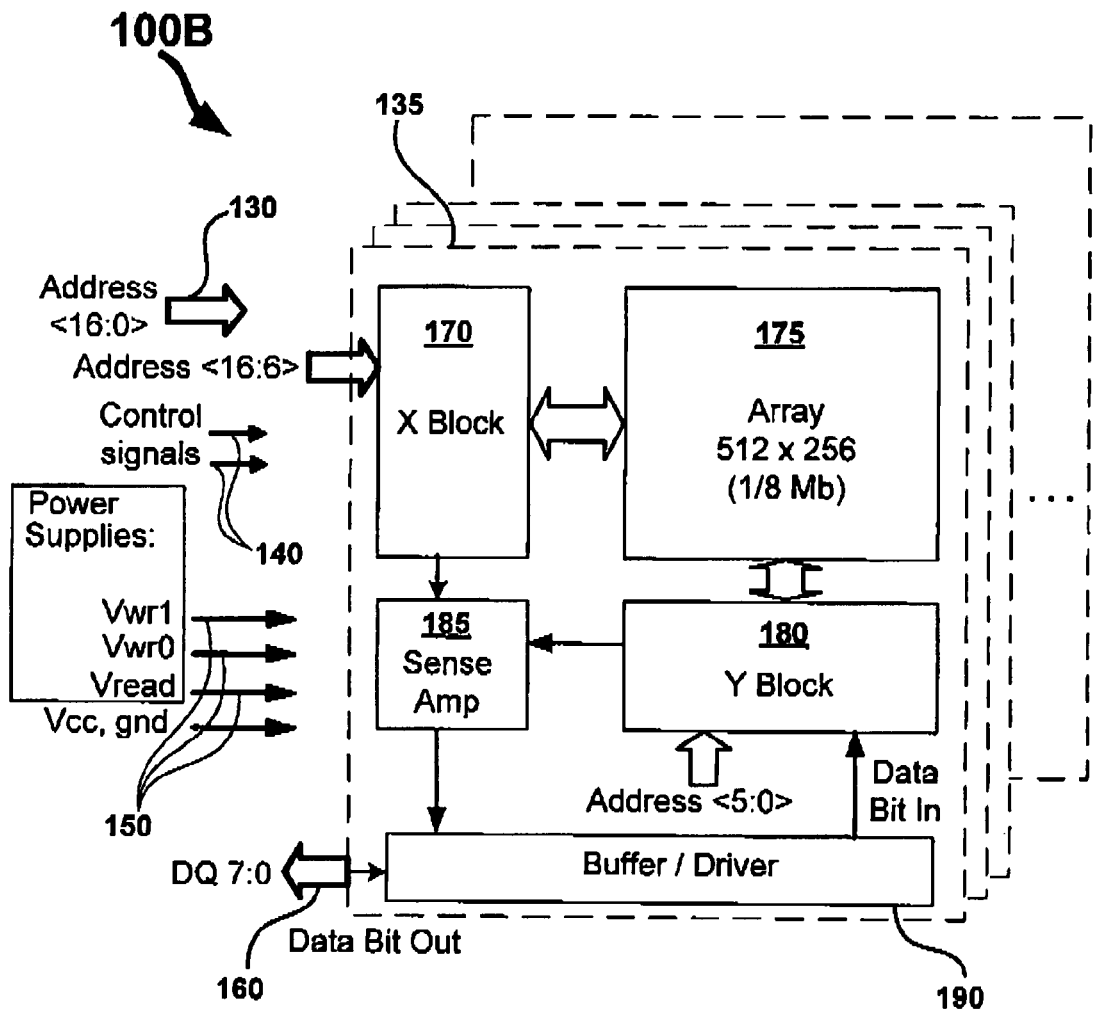
FIG. 1B depicts a block diagram of a representative implementation of an exemplary 1 MB memory with its peripheral circuitry.
Figure 1C:
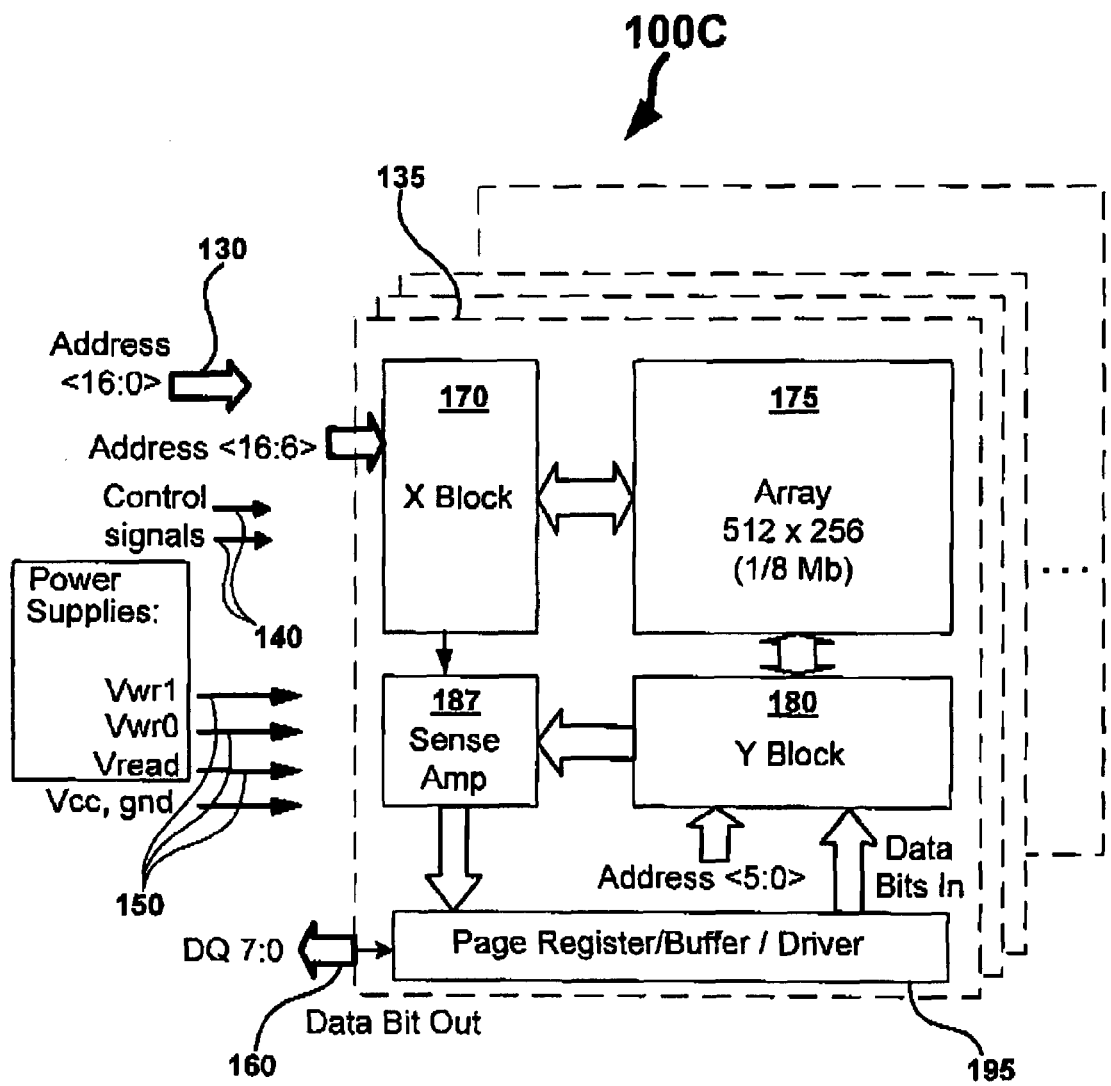
FIG. 1C depicts a block diagram of a representative implementation of an exemplary 1 MB memory with its peripheral circuitry that is capable of reading multiple bits.

As was described in U.S. application Ser. No. 11/021,600, filed Dec. 23, 2004, titled "Enhanced Functionality in a Two Terminal Memory Array," hereby incorporated by reference in its entirety and for all purposes, FIG. 1B and FIG. 1C are block diagrams of representative implementations of the access circuitry 108 depicted in FIG. 1. Physical layouts might differ, but the active circuitry of each memory bit block 135 would typically be formed on separate portions of a semiconductor substrate while each memory array layer 175 would be vertically stacked, in FIG. 1B, input signals into the memory 100B can include an address bus 130, a control bus 140, some power supplies 150 (typically Vcc and ground—the other signals of bus 150 can be internally generated by the 1 MB memory 100B), and a data bus 160. The control bus 140 typically includes signals to select the chip, to signal whether a read or write operation should be performed, and to enable the output buffers when the chip is in read mode. The address bus 130 specifies which location in the memory array is accessed—some portion of the addresses go to the X block 170 (typically including a predecoder and an X-decoder) to select one line out of the horizontal array lines. The other portion of the addresses go to a Y block 180 (typically including a predecoder and a Y-decoder) to apply the appropriate voltage on specific vertical lines. Each memory bit block 135 operates on one line of the memory chip data bus 160.

The reading of data from the memory array layer 175 is relatively straightforward: an x-line is energized, and current is sensed by the sensing circuits 185 on energized y-lines. During a write operation, the data is applied from the data bus 160 to the input buffers and data drivers 190 to the selected lines.

FIG. 1C is a block diagram of peripheral circuitry (170, 180, and 195) that includes sensing circuits 187 that are capable of reading multiple bits. The simultaneous reading of multiple bits involves sensing current from multiple y-lines simultaneously.

When binary information is sent to the memory chip 100C, it is stored in latch circuits within the circuits 195. Within the circuits 195, each y-line can either have an associated driver circuit or a group of y-lines can share a single driver circuit if the non-selected lines in the group are held to a constant voltage that would not cause the unselected memory plugs to experience any change in resistance. As an example, there may be 1024 y-lines in a cross point array, and the page register may include 8 latches, in which case the y-block 180 would decode 1 out of 128 y-lines and connect the selected lines to block 195. The driver circuit then writes the 1 or 0 to the appropriate memory plug. The writing can be performed in multiple cycles. In a scheme described in PCT Patent Application No. PCT/US04/13836, filed May 3, 2004, all the 1s can be written during a first cycle and all the 0s can be written during a second cycle. As described below, certain memory plugs can have multiple stable distinct resistive states. With such multi-level resistance memory plugs, driver circuits could program, for example, states of 00, 01, 10 or 11 by varying write voltage magnitude or pulse length.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Figure 2:
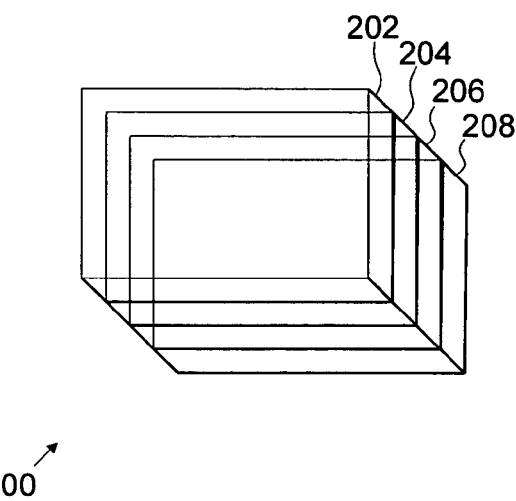
FIG. 2 illustrates an exemplary vertical memory layer configuration.

FIG. 2 illustrates an exemplary vertical memory layer configuration. In some embodiments, storage systems may be developed using layers to vertically stack controller and memory implementations. Here, system 200 may be a chip (e.g., semiconductor) that has been developed using layers 202-208, each of which is vertically stacked relative to the other layers. In some embodiments, each of layers 202-208 may be implemented as a memory array of cells (e.g., memory 104, memory 106, memory 114, as shown and described above in FIG. 1) or controller. Each layer may be divided into sub-planes, wherein each sub-plane may represent a physical portion of a layer. Each sub-plane may include memory logic, controller logic, memory, or other functionality. By dividing each layer into sub-planes, functionality in a vertically-stacked configuration may be varied in order to achieve a desired capacity or level of processing capacity for data storage on a chip. Between each layer, metal or other materials may be used to provide conductive connections between the layers (e.g., vias, thrus), enabling electrical current to flow between the memory layers. For example, vias may be used to retrieve data from a particular cell in a memory layer implemented at layer 202. Controller logic implemented at memory layer 208, based on an address for the desired cell in the memory array, retrieves data stored at the memory layer by sending an electrical current to determine the resistance state of the cell (e.g., one resistance state may be interpreted as a "0" and another resistance state resolves to a "1", providing the ability for each cell to indicate a binary data bit).

In some embodiments, memory and controller layers may be vertically stacked in alternating layers or in groups of memory and controller layers. Memory and controller layers may be vertically configured with alternating layers of memory and controller logic to increase capacity. Additional substrates may also be vertically stacked, resulting in a combination of multiple chips. Examples of such configurations are discussed in greater detail below in connection with FIG. 7, and may be realized with well-known technologies, such as flip chips (typically using conductive bumps to electrically couple chips), multi-chip packaging (typically using thin wire bonds to couple chips), and through-wafer interconnects (typically etching vias to couple chips) to connect chips Referring back to FIG. 2, vertical configurations enable additional functionality without using large die sizes or incurring expensive testing methods and facilities for either combined controller/memory or separate controller and memory systems. Other embodiments may be implemented in addition to those described above.

Figure 3:
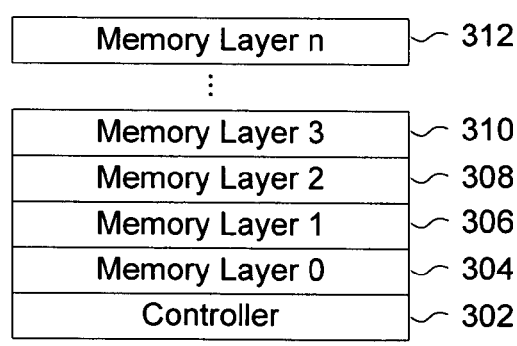
FIG. 3 illustrates an alternative exemplary vertical memory layer configuration.

FIG. 3 illustrates an alternative exemplary vertical memory layer configuration. In some embodiments, storage systems may be developed similarly to system 300. Here, configuration 300 includes controller 302 which is vertically configured with memory layers 304-312. In other embodiments, the number of memory layers may be modified to include more or fewer layers. In still other embodiments, additional controllers may be included with controller 302. Additional functionality may also be implemented by controller 302, some of which are described above in connection with FIG. 1.

Here, memory layers 304-312 may be stacked in different numbers of layers to allow different circuit patterns of varying capacities to be produced from a single mask set. By increasing or decreasing the numbers of memory layers 304-312, the capacity of produced circuit patterns may be varied. For example, if a small capacity for a circuit is sought, a single memory layer may be built during the fabrication process. If a larger memory capacity is desired, additional memory layers may be added. In some embodiments, memory layers may be added until design and process constraints are reached. In some embodiments, four (4) memory layers may be used in a system design. In other embodiments, up to N layers may be used. In some embodiments the controller 302 is the same, regardless of the number of memory layers that are used. With that architecture, a single design would have the capability to access an arbitrary number of memory layers. As an example, a single controller design might be able to manage 1 to N memory layers. As another example, a single controller design might be able to manage either N memory layers or M memory layers. The controller could simply return an error message if the external system attempted to address a non-existent memory layer.

Vertical memory layers can be efficiently stacked when the memory cell has only two terminals and is arranged in a cross point memory array. Stacked cross point memory arrays can either share metal layers between vertically adjacent memory cells, (e.g., Memory Layer 0 304 and Memory Layer 1 306 share columns and Memory Layer 1 305 and Memory Layer 2 308 share rows) or have isolated conductive array lines (e.g., the rows and columns of Memory Layer 0 304 are independent from the rows and columns of Memory Layer 1 306). U.S. patent application Ser. No. 11/095,026, filed Mar. 30, 2005, and titled "Memory Using Mixed Valence Conductive Oxides," hereby incorporated by reference in its entirety and for all purposes, describes two terminal memory cells that can be arranged in a cross point array. The application describes a two terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity.

Figure 4:
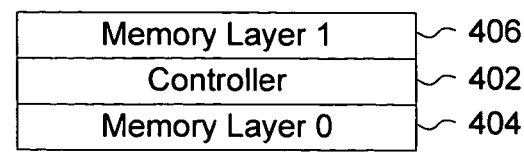
FIG. 4 illustrates alternative exemplary vertical memory layer configuration.

FIG. 4 illustrates alternative exemplary vertical memory layer configuration. In some embodiments, controller and memory layers may be arranged in various configurations. Here, system 400 includes controller 402 and memory layers 404 and 406. In some embodiments, controller 402 may be disposed between memory layers 404 and 406. Fabrication designs and processes for placing controller 402 and memory layers 404 and 406 on a chip may be varied to produce systems with different memory capacities. For example, a system may be fabricated by placing controller blocks between memory layers. The pattern described here may be repeated to produce systems of varying memory capacity. By repeating the pattern shown in system 400, additional memory capacity and controller functionality may be increased.

Figure 5:
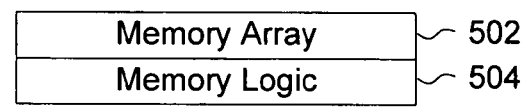
FIG. 5 illustrates an exemplary controller and memory configuration.

FIG. 5 illustrates an exemplary controller and memory configuration. In some embodiments, memory configuration 500 includes memory array 502 and memory logic 504. Here, memory array 502 provides an array of storage cells, each of which may be referenced by an address (e.g., row address, column address). Memory array 502 may be used to store data according to memory logic 504. In other embodiments, system 500 may be fabricated using more than one memory array. For example, several memory layers may be fabricated on top of memory logic 504, which may be integrated with other controller logic or functionality.

Figure 6:
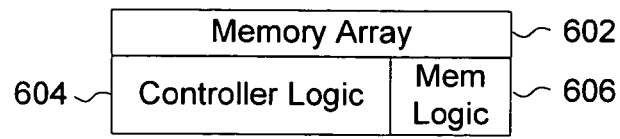
FIG. 6 illustrates an alternative exemplary controller and memory configuration.

FIG. 6 illustrates an alternative exemplary controller and memory configuration. Here, memory array 602 is fabricated on top of controller logic 604 and memory logic 606. In some embodiments, logic for system 600 may be implemented using more than one block. Controller logic 604 may be used to implement functionality in addition to those performed by memory logic 606. Functions such as ECC, CRC, disparity (unique parity generation on encoded words) checking and generation, data interpretation and handling, handshaking, and the like may be implemented by controller logic 604 and memory logic 606. Additionally, addressing functions may also be implemented by controller logic 604 or memory logic 606. For example, when a data request is received, controller logic 604 may interpret the request, coordinating the retrieval of data from memory array 602 from addresses indicated by memory logic 606.

Figure 7:
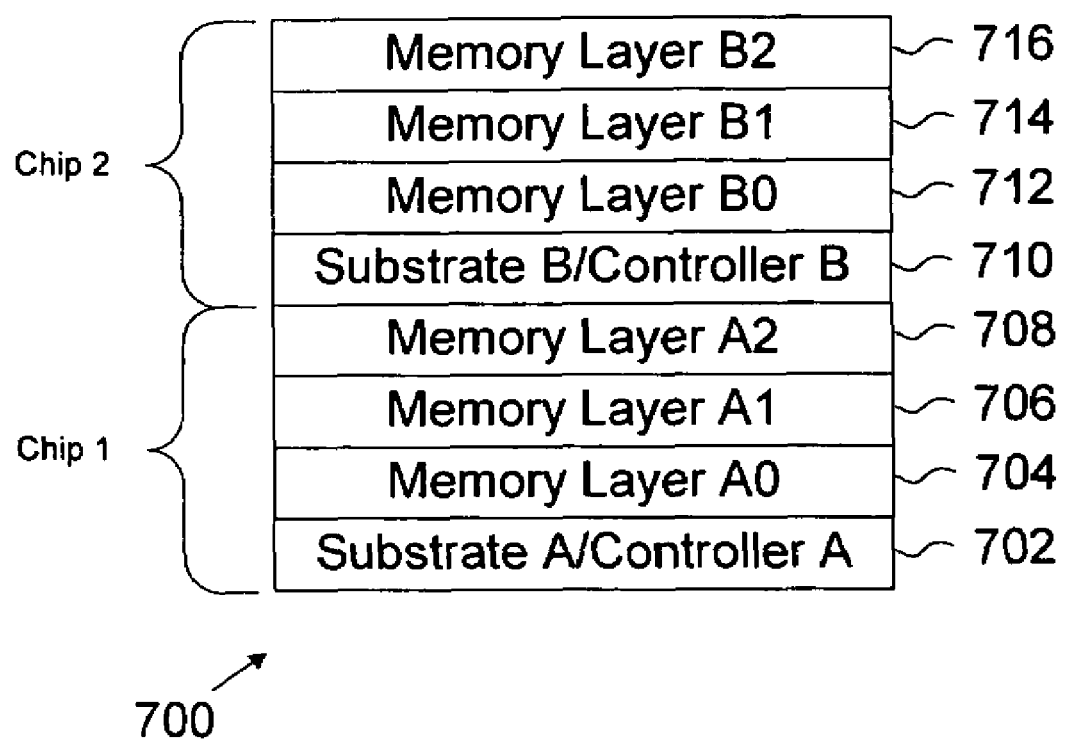
FIG. 7 illustrates another alternative exemplary controller and memory configuration.

FIG. 7 illustrates another alternative exemplary controller and memory configuration. System 700 includes two chips (e.g., chip 1 and chip 2), both of which are vertically stacked relative to each other. Here, the first chip has substrate A 702 which includes controller logic A, and memory layers A0 704, A1 706 and A2 708. The second chip has substrate B 710 which includes controller logic B, and memory layers B0 712, B1 714 and B2 716. In other embodiments, additional chips may be formed by vertically stacking chips relative to each other. Other variations may be performed using different numbers of controllers and memory layers, with or without additional substrates.

Figure 8:
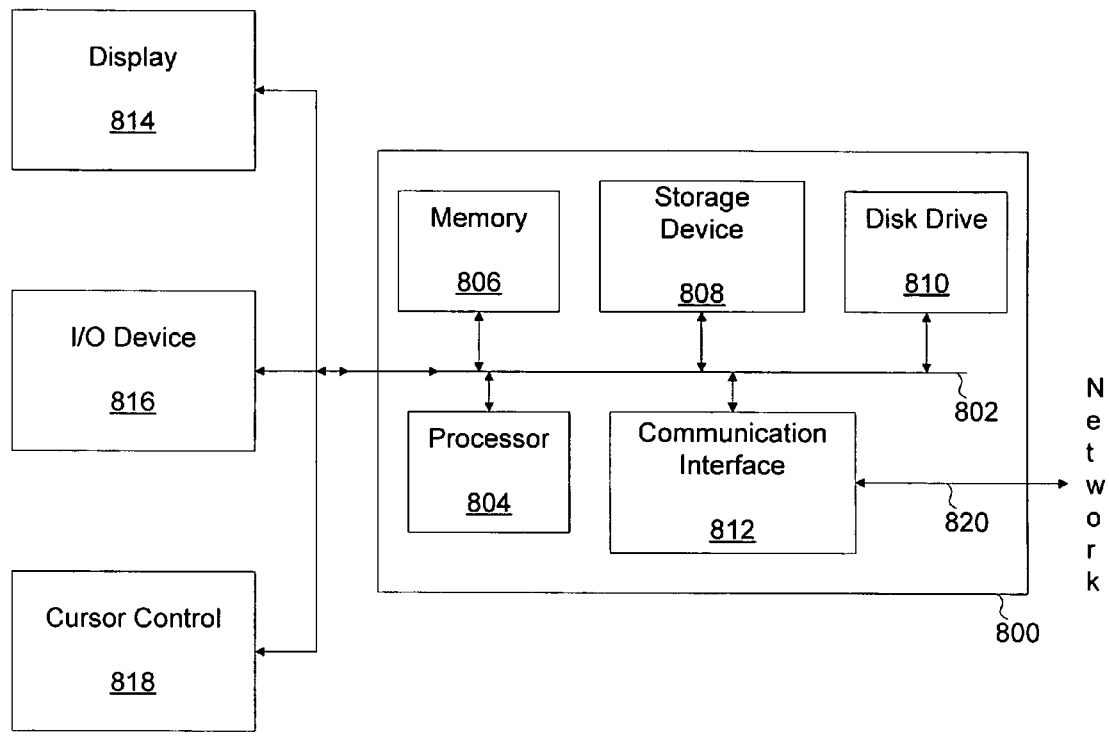
FIG. 8 is a block diagram illustrating an exemplary computer system suitable for storage development using a vertical memory.

FIG. 8 is a block diagram illustrating an exemplary computer system suitable for storage development using a vertical memory. In some embodiments, computer system 800 may be used to implement computer programs, applications, methods, or other software to perform the above-described techniques for fabricating storage systems such as those described above. Computer system 800 includes a bus 802 or other communication mechanism for communicating information, which interconnects subsystems and devices, such as processor 804, system memory 806 (e.g., RAM), storage device 808 (e.g., ROM), disk drive 810 (e.g., magnetic or optical), communication interface 812 (e.g., modem or Ethernet card), display 814 (e.g., CRT or LCD), input device 816 (e.g., keyboard), and cursor control 818 (e.g., mouse or trackball).

According to some embodiments of the invention, computer system 800 performs specific operations by processor 804 executing one or more sequences of one or more instructions stored in system memory 806. Such instructions may be read into system memory 806 from another computer readable medium, such as static storage device 808 or disk drive 810. In some embodiments, hard-wired circuitry may be used in place of or in combination with software instructions to implement the invention.

The term "computer readable medium" refers to any medium that participates in providing instructions to processor 804 for execution. Such a medium may take many forms, including but not limited to, non-volatile media, volatile media, and transmission media. Non-volatile media includes, for example, optical or magnetic disks, such as disk drive 810. Volatile media includes dynamic memory, such as system memory 806. Transmission media includes coaxial cables, copper wire, and fiber optics, including wires that comprise bus 802. Transmission media can also take the form of radio or light waves.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In some embodiments of the invention, execution of the sequences of instructions to practice the invention is performed by a single computer system 800. According to some embodiments of the invention, two or more computer systems 800 coupled by communication link 820 (e.g., LAN, PSTN, or wireless network) may perform the sequence of instructions to practice the invention in coordination with one another. Computer system 800 may transmit and receive messages, data, and instructions, including program, i.e., application code, through communication link 820 and communication interface 812. Received program code may be executed by processor 804 as it is received, and/or stored in disk drive 810, or other non-volatile storage for later execution.

Although the foregoing embodiments have been described in some detail for purposes of clarity of understanding, the invention is not limited to the details provided. There are many alternative ways of implementing the invention. The disclosed embodiments are illustrative and not restrictive.

What is claimed:

1. A data storage system, comprising:
   a controller that communicates with external devices through at least one interface; and
   at least one non-volatile re-programmable memory array vertically stacked on top of peripheral circuitry, the peripheral circuitry in electrical communication with the controller and the at least one non-volatile re-programmable memory array,
   wherein the controller processes requests from the external devices to store and retrieve data received over the at least one interface, accesses the at least one non-volatile memory array, and performs diagnostic functions on the at least one non-volatile memory array, and
   wherein the controller is operable to manage multiple configurations, at least one configuration being N layers of vertically stacked non-volatile re-programmable memory arrays and at least one configuration being M layers of vertically stacked non-volatile re-programmable memory arrays.

2. The data storage system of claim 1, wherein the controller conducts an initialization sequence when power is applied.

3. The data storage system of claim 1, wherein the controller responds to a DMA request over the interface by controlling data flow.

4. The data storage system of claim 1, wherein the controller performs at least one error correction function selected from the group consisting of parity checking, CRC checking, ECC checking, and disparity checking.

5. The data storage system of claim 1, wherein at least two non-volatile re-programmable memory arrays are vertically stacked.

6. The data storage system of claim 5, wherein each of the at least two non-volatile re-programmable memory arrays include two terminal memory elements that change conductivity responsive to a voltage drop across the two terminals.

7. The data storage system of claim 5, wherein a first non-volatile memory array has a first memory capacity and a second non-volatile memory array has a second memory capacity.

8. The data storage system of claim 1, wherein a plurality of vias provide electrical connections between the peripheral circuitry and the at least one non-volatile re-programmable memory array.

9. The data storage system of claim 1 and further comprising:
   a substrate, wherein the controller is fabricated on the substrate and the memory system is fabricated above the peripheral circuitry.

10. A method for fabricating a storage system, comprising:
    providing controller circuitry;
    providing a substrate;
    forming peripheral circuitry onto the substrate, the peripheral circuitry operable to interface with the controller circuitry;
    vertically stacking a non-volatile re-programmable memory array over the peripheral circuitry so that the non-volatile re-programmable memory array is positioned on top of the peripheral circuitry and is in electrical communication with the peripheral circuitry,
    wherein the controller circuitry is operable to process requests to store and retrieve data received over the controller interface, access the non-volatile memory array, and perform diagnostic functions on the non-volatile memory array, and
    wherein the controller circuitry is operable to manage multiple configurations, at least one configuration being N layers of vertically stacked non-volatile re-programmable memory arrays and at least one configuration being M layers of vertically stacked non-volatile re-programmable memory arrays.

11. The method recited in claim 10 and further comprising:
    vertically stacking a second non-volatile re-programmable memory array over the non-volatile re-programmable memory array.

12. The method recited in claim 11, wherein the second non-volatile memory array has a smaller capacity than the non-volatile re-programmable memory array.

13. A computer program product for fabricating a storage system, the computer program product being embodied in a computer readable medium and comprising computer instructions for:
    providing a substrate;
    forming controller circuitry onto the substrate;
    forming peripheral circuitry in electrical communication with the controller circuitry;
    forming a controller interface that is in electrical communication with the controller circuitry; and
    vertically stacking a non-volatile re-programmable memory array over the peripheral circuitry, the non-volatile re-programmable memory array in electrical communication with the peripheral circuitry,
    wherein the controller circuitry is operable to process requests to store and retrieve data received over the controller interface, access the non-volatile memory array, and perform diagnostic functions on the non-volatile memory array,
    wherein the controller circuitry is operable to manage multiple configurations, at least one configuration being N layers of vertically stacked non-volatile memory arrays and at least one configuration being M layers of vertically stacked non-volatile memory arrays.

* * * * *